US012746613B2

(12) United States Patent
Kotler et al.

(10) Patent No.: US 12,746,613 B2
(45) Date of Patent: Sep. 29, 2026

(54) REPAIR OF SOLDER BUMPS

(71) Applicant: ORBOTECH LTD., Yavne (IL)

(72) Inventors: Zvi Kotler, Tel Aviv (IL); Ofer Fogel, Jerusalem (IL); Sharona Cohen, Nof Ayalon (IL); Gil Bernstein Toker, Ramat Rachel (IL); Niv Gorodesky, Rehovot (IL)

(73) Assignee: Orbotech Ltd., Yavne (IL)

(*) Notice: Subject to any disclaimer, the term of this patent is extended or adjusted under 35 U.S.C. 154(b) by 258 days.

(21) Appl. No.: 18/552,746

(22) PCT Filed: Jul. 19, 2021

(86) PCT No.: PCT/IB2021/056490
§ 371 (c)(1),
(2) Date: Sep. 27, 2023

(87) PCT Pub. No.: WO2022/106914
PCT Pub. Date: May 27, 2022

(65) Prior Publication Data

US 2024/0222302 A1 Jul. 4, 2024

Related U.S. Application Data

(60) Provisional application No. 63/116,924, filed on Nov. 23, 2020.

(51) Int. Cl.
*B23K 1/005* (2006.01)
*B23K 1/00* (2006.01)
(Continued)

(52) U.S. Cl.
CPC .......... *B23K 1/0056* (2013.01); *B23K 1/0016* (2013.01); *B23K 3/047* (2013.01);
(Continued)

(58) Field of Classification Search
CPC ................ B23K 1/0016; B23K 1/0056; B23K 2101/40; B23K 3/047; B23K 3/0638;
(Continued)

(56) References Cited

U.S. PATENT DOCUMENTS 6,346,352 B1 2/2002 Hayden et al.
6,911,388 B2 6/2005 Kee et al.
(Continued)

FOREIGN PATENT DOCUMENTS

JP 2001135666 A 5/2001
JP 2010109325 A 5/2010
(Continued)

OTHER PUBLICATIONS

WIPO, International Search Report for International Application No. PCT/IB2021/056490, Dec. 19, 2021.
(Continued)

*Primary Examiner* — Ibrahime A Abraham
*Assistant Examiner* — Joseph W Iskra
(74) *Attorney, Agent, or Firm* — Hodgson Russ LLP

(57) ABSTRACT

A method for circuit fabrication includes inspecting an array of solder bumps on a circuit substrate so as to identify a solder bump having a height above the substrate that is greater than a predefined maximum. A first laser beam is directed toward the identified solder bump so as to ablate a selected amount of a solder material from the identified solder bump. Alternatively or additionally, a further solder bump having a height above the substrate that is less than a predefined minimum is identified, and one or more molten droplets of the solder material are deposited on the further solder bump. After ablating or depositing the solder material, a second laser beam is directed toward the identified solder bump with sufficient energy to cause the solder material in the identified solder bump to melt and reflow.

9 Claims, 7 Drawing Sheets

(51) Int. Cl.

| | |
|---|---|
| ***B23K 3/047*** | (2006.01) |
| ***B23K 3/06*** | (2006.01) |
| ***B23K 3/08*** | (2006.01) |
| ***B23K 101/40*** | (2006.01) |
| ***H10P 74/00*** | (2026.01) |
| ***H10W 72/00*** | (2026.01) |

(52) U.S. Cl.
CPC .............. *B23K 3/0638* (2013.01); *B23K 3/08* (2013.01); *H10P 74/23* (2026.01); *B23K 2101/40* (2018.08); *H10W 72/0112* (2026.01); *H10W 72/012* (2026.01); *H10W 72/01223* (2026.01); *H10W 72/01251* (2026.01); *H10W 72/01257* (2026.01)

(58) Field of Classification Search
CPC ........... B23K 3/08; H01L 22/12; H01L 22/20; H01L 2224/11318; H01L 2224/1183; H01L 2224/11849; H01L 2224/119; H01L 2224/11901; H01L 2224/131; H01L 2224/13111; H01L 2224/13139; H01L 2224/1403; H01L 2224/16227; H01L 2224/742; H01L 2224/81815; H01L 24/11; H01L 24/14; H01L 24/16; H01L 24/742; H01L 24/81; H01L 2924/00014; H01L 2924/014; H01L 2924/3841; H01L 2924/00012; H05K 13/0465; H05K 13/083
USPC ........................................................ 219/121.6
See application file for complete search history.

(56) References Cited

U.S. PATENT DOCUMENTS

| | | | | |
|---|---|---|---|---|
| 9,925,797 | B2 | 3/2018 | Kotler et al. | |
| 2001/0041518 | A1* | 11/2001 | Hembree | H01L 21/4853 257/E21.53 |
| 2008/0173697 | A1* | 7/2008 | Herz | H05K 3/3478 228/119 |
| 2010/0230472 | A1 | 9/2010 | Okamoto et al. | |
| 2014/0004660 | A1* | 1/2014 | Sung | H01L 23/49811 257/E21.499 |
| 2014/0263211 | A1 | 9/2014 | Hassan et al. | |
| 2016/0233089 | A1 | 8/2016 | Zenou et al. | |
| 2018/0281243 | A1 | 10/2018 | Zenou et al. | |
| 2022/0248540 | A1 | 8/2022 | Kotler et al. | |

FOREIGN PATENT DOCUMENTS

| | | | |
|---|---|---|---|
| JP | 2015056442 | A | 3/2015 |
| JP | 2018537699 | A | 12/2018 |
| KR | 20010085358 | A | 9/2001 |
| KR | 20170095593 | A | 8/2017 |
| WO | 2017085712 | A1 | 5/2017 |

OTHER PUBLICATIONS

JPO, Office Action issued for Japanese Patent Application No. 2023-530858, Jan. 14, 2025.

TIPO, Office Action issued for ROC (Taiwan) Patent Application No. 110136892, Nov. 21, 2024.

KIPO, Office Action issued in Korean Patent Application No. 10-2023-7020609, Jun. 13, 2025.

* cited by examiner

REPAIR OF SOLDER BUMPS

CROSS-REFERENCE TO RELATED APPLICATIONS

This application is a national phase entry under 35 U.S.C. § 371 of International Application No. PCT/IB2021/056490, filed Jul. 19, 2021, which claims priority to U.S. Provisional Patent Application No. 63/116,924, filed Nov. 23, 2020, the entire disclosures of which are incorporated by reference herein.

FIELD OF THE INVENTION

The present invention relates generally to fabrication of electronic devices, and particularly to methods and systems for soldering.

BACKGROUND

Solder bumps are electrically-conducting contact elements and are used, for example, in flip-chip bonding of semiconductor chips to circuit substrates. For this purpose, solder bumps are formed in a dense, tightly-spaced array on the circuit substrate, for example using photolithographic techniques. Solder bump technology has advantages of small dimensions and short connection lengths, enabling high connection density, low production costs, and high functionality of the package.

The production of solder bumps must be carefully controlled, however, since a single defective solder bump can lead to an open circuit or short circuit in the connection of a chip to a substrate. For this reason, a number of methods have been proposed for repairing defects in solder bump arrays. For example, Japanese Patent Application Publication JP 2010109325A describes a method for improving the yield of solder bumps. In one embodiment, a solder bump yield improving method divides connected solder bumps (i.e., solder bridges) by laser cutting with a laser head. In another embodiment, reflow is performed to the skip print position of the solder bump by a laser.

Some methods for solder bump repair involve replacing defective solder balls. For example, U.S. Pat. No. 6,911,388 describes a method for reworking a ball grid array (BGA) of solder balls using a single-ball extractor/placer apparatus having a heatable capillary tube pickup head optionally augmented with vacuum suction. A defective solder ball is identified, extracted by the pickup head and disposed of. A non-defective solder ball is picked up by the pickup head, positioned on the vacated attachment site, and thermally softened for attachment to the workpiece.

As another example, Korean Patent Application Publication KR 20170095593A describes a laser soldering repair process. A laser cleaning process is performed by irradiating a repair laser beam onto a repair region of the substrate. A solder ball is provided in a cleaned repair area of the substrate, and the solder ball is heated with a soldering laser beam to attach the solder ball to the repair area.

In laser direct-write (LDW) techniques, a laser beam is used to create a patterned surface with spatially-resolved three-dimensional structures by controlled material ablation or deposition. Laser-induced forward transfer (LIFT) is an LDW technique that can be applied in depositing micro-patterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier substrate before the photons are absorbed by the inner surface of the film. Above a certain energy threshold, material is ejected from the donor film toward the surface of the acceptor substrate. Given a proper choice of donor film and laser beam pulse parameters, the laser pulses cause molten droplets of the donor material to be ejected from the film, and then to land and harden on the acceptor substrate.

LIFT systems are particularly (though not exclusively) useful in printing conductive metal droplets and traces for purposes of electronic circuit fabrication. A LIFT system of this sort is described, for example, in U.S. Pat. No. 9,925,797, whose disclosure is incorporated herein by reference. This patent describes printing apparatus, including a donor supply assembly, which is configured to provide a transparent donor substrate having opposing first and second surfaces and a donor film formed on the second surface so as to position the donor film in proximity to a target area on an acceptor substrate. An optical assembly is configured to direct multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

SUMMARY

Embodiments of the present invention that are described hereinbelow provide improved methods and system for fabrication of electrical circuits and devices.

There is therefore provided, in accordance with an embodiment of the invention, a method for circuit fabrication, which includes inspecting an array of solder bumps on a circuit substrate so as to identify a solder bump having a height above the substrate that is greater than a predefined maximum. A first laser beam is directed toward the identified solder bump so as to ablate a selected amount of a solder material from the identified solder bump. After ablating the solder material, a second laser beam is directed toward the identified solder bump with sufficient energy to cause the solder material remaining in the identified solder bump to melt and reflow.

In some embodiments, directing the first laser beam includes directing one or more pulses of laser energy to impinge on the identified solder bump. In the disclosed embodiments, each of the pulses has a pulse duration that is less than 50 ns, or even less than 10 ns. Additionally or alternatively, inspecting the array includes estimating, responsively to the height of the identified solder bump, the amount of the solder material to be removed from the identified solder bump, and directing the one or more pulses includes selecting a number of the pulses to apply to the identified solder bump responsively to the estimated amount.

Further additionally or alternatively, directing the first laser beam includes focusing the first laser beam to impinge on the identified solder bump with a beam diameter that is less than the bump diameter, so that ablation of the solder material creates a cavity in a central area of the identified solder bump. In a disclosed embodiment, directing the second laser beam toward the identified solder bump causes the solder material to melt and reflow so as to fill the cavity.

In one embodiment, directing the first and second laser beams toward the identified solder bump includes repeating the steps of directing the first laser beam so as to ablate the solder material and directing the second laser beam so as to cause the solder material to melt and reflow multiple times until the height of the solder bump has fallen below the predefined maximum.

Additionally or alternatively, directing the first laser beam includes positioning a transparent cover over the substrate in proximity to the identified solder bump, and directing the first laser beam to irradiate the identified solder bump through the transparent cover, whereby debris ejected due to ablation of the identified solder bump adheres to the cover.

In some embodiments, directing the second laser beam includes directing one or more pulses of laser energy to impinge on the identified solder bump. Typically, each of the pulses has a pulse duration that is less than 100 μs. Additionally or alternatively, directing the first and second laser beams includes generating both the first and the second laser beam using a single laser having a variable pulse duration. Further additionally or alternatively, directing the second laser beam includes focusing the second laser beam to impinge on the identified solder bump with a beam diameter that is less than the bump diameter.

In one embodiment, directing the second laser beam includes applying sufficient energy to the identified solder bump, using the second laser beam, to melt an entire volume of the identified solder bump. Alternatively, directing the second laser beam includes applying an amount of energy to the identified solder bump, using the second laser beam, that is selected so as to melt only a part of the identified solder bump.

In some embodiments, inspecting the array of solder bumps includes identifying a further solder bump having a height above the substrate that is less than a predefined minimum, and the method includes depositing one or more molten droplets of the solder material on the further solder bump, and directing the second laser beam toward the further solder bump with sufficient energy to cause the deposited solder material to melt and reflow into the further solder bump. In one such embodiment, ejecting the one or more molten droplets includes applying the first laser beam to direct one or more pulses of laser energy through the donor substrate in order to induce ejection of the molten droplets.

There is also provided, in accordance with an embodiment of the invention, a method for circuit fabrication, which includes inspecting an array of solder bumps on a circuit substrate so as to identify a solder bump having a height above the substrate that is less than a predefined minimum. One or more molten droplets of a solder material are deposited on the identified solder bump, whereby the droplets adhere to and harden on the identified solder bump. After depositing the solder material, a laser beam is directed toward the identified solder bump with sufficient energy to cause the deposited solder material to melt and reflow into the identified solder bump.

In some embodiments, depositing the one or more molten droplets includes ejecting the one or more molten droplets from a donor substrate in proximity to the identified solder bump by a process of laser-induced forward transfer (LIFT). Typically, the donor substrate is transparent and has opposing first and second surfaces and a donor film including the solder material on the second surface such that the donor film is in proximity to the identified solder bump, and ejecting the one or more molten droplets includes directing one or more pulses of laser radiation to pass through the first surface of the donor substrate and impinge on the donor film so as to induce ejection from the donor film onto the identified solder bump of the one or more molten droplets of the solder material. In one embodiment, directing the one or more pulses of laser radiation in the process of LIFT and directing the laser beam toward the identified solder bump includes using a single laser having a variable pulse duration for both ejecting the molten droplets and causing the deposited solder material to melt and reflow.

Additionally or alternatively, inspecting the array includes estimating, responsively to the height of the identified solder bump, an amount of the solder material to be added to the identified solder bump, and depositing the one or more molten droplets includes selecting a number of the droplets to deposit on the identified solder bump responsively to the estimated amount.

In a disclosed embodiment, depositing the one or more molten droplets and directing the laser beam toward the identified solder bump include repeating the steps of depositing the molten droplets of the solder material and directing the laser beam so as to cause the solder material to melt and reflow multiple times until the height of the solder bump has risen above the predefined minimum.

There is additionally provided, in accordance with an embodiment of the invention, apparatus for circuit fabrication, including an inspection module, which is configured to capture image data with respect to an array of solder bumps on a circuit substrate. A laser module is configured to output a first laser beam configured to ablate a solder material from the solder bumps, and a second laser beam configured to cause the solder material in the solder bumps to melt and reflow. Control circuitry is configured to process the image data so as to identify a solder bump in the array having a height above the substrate that is greater than a predefined maximum, and to control the laser module so as to direct the first laser beam toward the identified solder bump so as to ablate a selected amount of the solder material from the identified solder bump, and after ablating the solder material, to direct the second laser beam toward the identified solder bump with sufficient energy to cause the solder material remaining in the identified solder bump to melt and reflow.

There is further provided, in accordance with an embodiment of the invention, apparatus for circuit fabrication, including an inspection module, which is configured to capture image data with respect to an array of solder bumps on a circuit substrate. A deposition module is configured to eject molten droplets of a solder material. A laser module is configured to output a laser beam configured to cause the solder material in the solder bumps to melt and reflow. Control circuitry is configured to process the image data so as to identify a solder bump in the array having a height above the substrate that is less than a predefined minimum, and to control the deposition module so as to deposit one or more of the molten droplets of the solder material on the identified solder bump, whereby the droplets adhere to and harden on the identified solder bump, and after ablating the solder material, to control the laser module so as to direct the laser beam toward the identified solder bump with sufficient energy to cause the deposited solder material to melt and reflow into the identified solder bump.

The present invention will be more fully understood from the following detailed description of the embodiments thereof, taken together with the drawings in which:

DETAILED DESCRIPTION OF EMBODIMENTS

Overview

Figure 1:
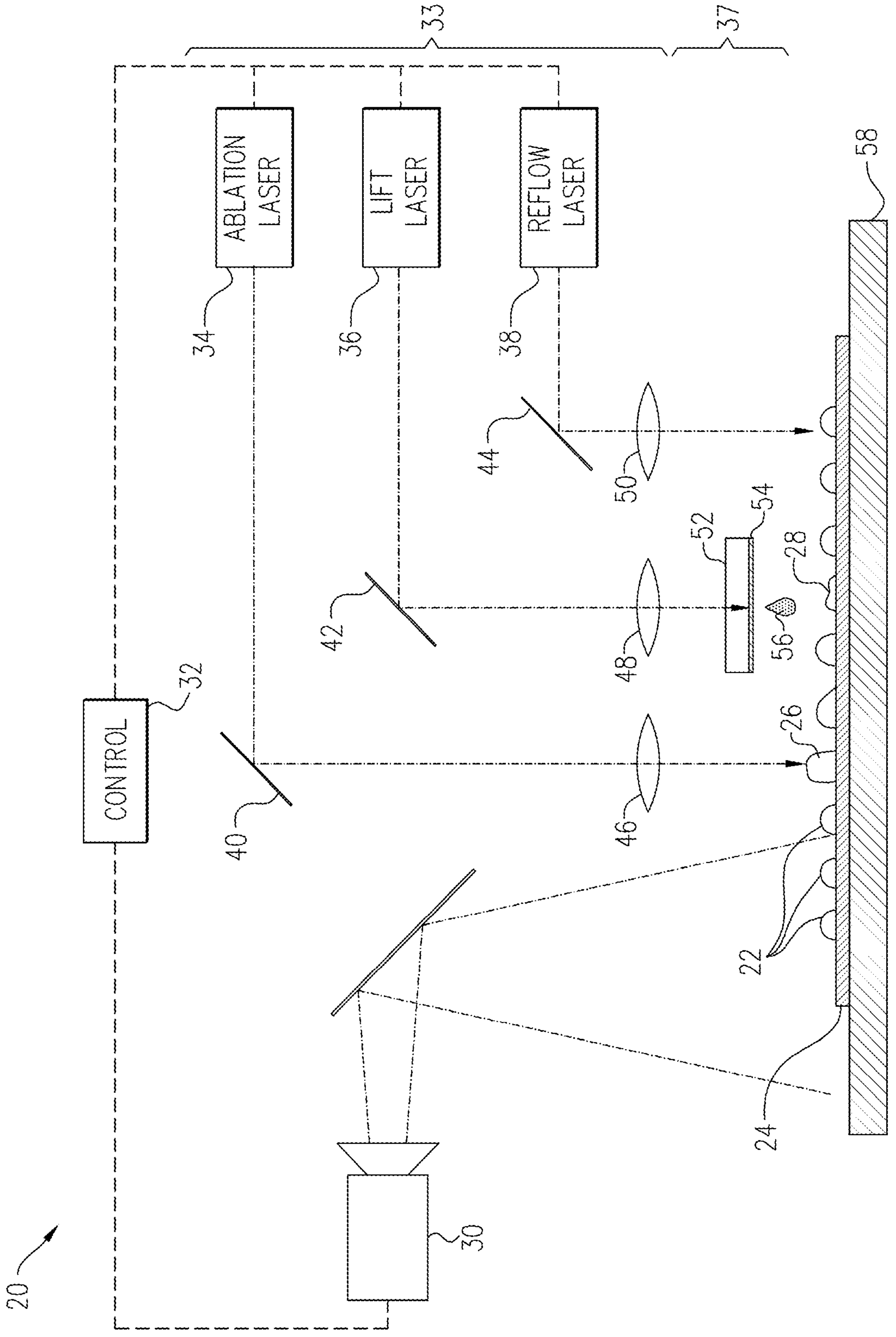
FIG. 1 is schematic side view of a system for solder bump repair, in accordance with an embodiment of the invention.

When producing an array of solder bumps on a substrate, it is important not only that all of the bumps be present and electrically separate from one another, but also that all the solder bumps be of roughly equal size. For example, in a solder bump array that is to be used in flip-chip mounting, if the volume of a solder bump is too small, its height above the substrate will be lower than that of its neighbors and may leave an open circuit when a chip is mounted on the array. On the other hand, if the volume of a solder bump is too large, with a concomitant increase in bump height, the excess solder material may spread as it melts in the reflow stage after mounting the chip, leading to short circuits with other solder bumps and circuit pads. A single defective solder bump, whether too small or too large, can compromise the functionality of an entire circuit.

To avoid loss of yield due to solder bump defects of these sorts, there is a need to inspect solder bumps on circuit substrates and to repair defective solder bumps that are identified during inspection. The repair steps should desirably include both removal of excess solder material from bumps that are too large and addition of solder material to bumps that are too small. In some embodiments of the present invention, these steps are both carried out in the same repair station. Alternatively, the steps of removing solder material from oversize bumps and adding solder material to undersize bumps may be carried out separately and independently of one another. Embodiments of the present invention that are described herein provide solutions for repairing both oversize and undersize solder bumps.

In some embodiments, an inspection module inspects an array of solder bumps on a circuit substrate so as to identify solder bumps having a height above the substrate that is greater than a predefined maximum. Upon identifying such a solder bump, a laser module directs a laser beam toward the solder bump so as to ablate a selected amount of a solder material from the solder bump. This ablation typically alters not only the size, but also the shape of the solder bump relative to its neighbors in the array. Therefore, after ablating the solder material, the laser module directs another laser beam toward the solder bump with sufficient energy to cause the solder material remaining in the identified solder bump to melt and reflow, thus assuming the same rounded shape as the other solder bumps in the array. This ablation technique may also be used to remove excess solder material from solder bumps that do not have the desired rounded shape, even if their height is not excessive.

Typically, the laser beams that are used in both the ablation and the reflow steps are pulsed beams, though with differences in pulse durations and possibly other beam parameters. They may be generated by the same laser or by different lasers with appropriate properties. The ablation step can use multiple successive pulses, with the number of pulses adjusted depending on the initial height of the solder bump, i.e., on the amount of material that is to be removed. In some cases, the ablation and reflow steps are applied iteratively in multiple cycles, until the height of the solder bump has fallen below the predefined maximum.

Additionally or alternatively, the inspection module identifies solder bumps having a height above the substrate that is below a predefined minimum. In this case, one or more molten droplets of solder material are deposited onto each of the undersize solder bumps, so that the droplets adhere to and harden on the solder bumps. After depositing the solder material, a laser beam is directed toward the solder bump with sufficient energy to cause the deposited solder material to melt and reflow into the identified solder bump. The number of droplets to be deposited on each such solder bump depending on the height of the bump. The droplet deposition and reflow steps may be applied iteratively in multiple cycles, until the height of the solder bump has risen above the predefined minimum. This same technique may be applied to fill in solder bumps that are missing entirely from an array.

In the embodiments described below, a LIFT process is used to deposit the droplets on undersize solder bumps, although other means for droplet ejection may alternatively be applied. In the LIFT process, pulses of laser radiation are focused onto a donor film of solder material, which is formed on the surface of a donor substrate in proximity to the solder bump, causing molten droplets of the solder material to be ejected from the donor film onto the solder bump. The same laser may be used for LIFT ejection as is used for ablation of oversize solder bumps, as described above, with appropriate adjustment of the laser beam focus and possibly other parameters. Additionally or alternatively, the laser used in the LIFT process may also be used in the reflow step. Alternatively, different lasers may be used for the different process steps.

The present embodiments thus provide a comprehensive solution to the problem of solder bump defects. By virtue of the use of laser technology for ablation and deposition of solder materials, the techniques described herein are applicable to all sorts of solder bump arrays, including dense arrays of very small solder bumps, with diameters as small as 20 μm or less, as well as larger-scale solder bumps with diameters of 150 μm or more. These techniques are equally applicable to conventional low-temperature solders, such as tin-based solders, and to high-temperature solders, such as silver alloys.

System Description

FIG. 1 is schematic side view of a system 20 for solder bump repair, in accordance with an embodiment of the invention. In the pictured example, system 20 is applied to inspect and repair an array of solder bumps 22 on a circuit substrate 24, such as a semiconductor, dielectric or ceramic substrate, as are known in the art. An oversize bump 26 protrudes above substrate 24 to a height that is greater than the other bumps 22, while an undersized bump 28 has a lower height than the other bumps. During the repair process, substrate 24 is held on a suitable mount, typically an adjustable mount such as a translation stage 58.

An inspection module 30 captures image data with respect to the array of solder bumps 22. Inspection module 30 typically comprises one or more optical sensors with depth-sensing capabilities, as are known in the art. For example, the inspection module may comprise a pair of image sensors with suitable optics for stereoscopic imaging; or it may comprise a pattern projector, which projects structured light onto substrate 24 and an image sensor, which captures an image of the pattern for purposes of triangulation. Alternatively, inspection module may comprise an interferometer or time-of-flight sensor, which scans over solder bumps 22 in order to measure their respective dimensions. The term "image data," as used in the context of the present description and in the claims, should be understood broadly to comprise any sort of data that can be used in reconstructing a three-dimensional (3D) profile of the features on substrate 24.

Control circuitry 32 processes the image data output by inspection module 30 in order to measure the heights of solder bumps 22 and identify bumps, such as bumps 26 and 28, whose height is greater than a predefined maximum or less than a predefined minimum height. Control circuitry 32 typically comprises a general-purpose computer processor, which is programmed in software to carry out the functions that are described herein, along with suitable interfaces for communicating with and controlling the other components of system 20. Alternatively or additionally, at least some of the functions of control circuitry 32 may be carried out by a digital signal processor (DSP) or hardware logic components, which may be hard-wired or programmable.

For purposes of solder bump repair, system 20 comprises a laser module 33, including one or more lasers and suitable optics for directing appropriate laser beams toward substrate 24. In the pictured embodiment, laser module 33 includes both an ablation laser 34 and a reflow laser 38, as well as a LIFT laser 36, which also serves as a part of a deposition module 37, as explained below. For the sake of simplicity, the functions and properties of these lasers are described here as though the lasers were all separate units (which is one possible implementation of laser module 33). Alternatively, a single laser, emitting short, high-energy pulses, may perform the functions of both ablation laser 34 and LIFT laser 36. The same laser may be configured, as well, to serve as reflow laser 38. Lasers 34, 36 and 38 emit optical radiation in the visible, ultraviolet, and/or infrared ranges at suitable wavelengths and with suitable temporal pulse lengths and focal qualities to perform the functions that are described herein, as detailed further in the description below.

Ablation laser 34 typically emits short pulses, for example with pulse length on the order of 50 ns, and high fluence, for example in the range of 5-15 $J/cm^2$. Laser 34 may operate at any wavelength that is absorbed by solder bumps 22, in the visible, ultraviolet or near infrared range. Alternatively, shorter laser pulses may be used, for example less than 10 ns or even in the range of 1 ns. A beam scanner 40 directs one or more pulses from laser 34 to impinge a solder bump from which solder material is to be ablated, such as bump 26. Each pulse ablates a certain amount of solder material from the bump. Control circuitry 32 may thus the choose the number of pulses to direct toward bump 26 based on the total amount of material to be ablated, as indicated by the height of the bump. Focusing optics 46 focus the beam onto bump 26, typically with a spot diameter that is less than the solder bump diameter, for example a spot diameter of about 10 μm or less.

Addition of solder material to undersize solder bumps is carried out using a deposition module 37, which in the present example comprises a LIFT donor substrate 52. LIFT laser 36 emits short pulses, with pulse duration typically on the order of 1 ns, toward donor substrate 52 under the control of control circuitry 32. Donor substrate 52 typically comprises a thin, flexible sheet of a transparent material, which is coated on the side in proximity to circuit substrate 24 with a donor film 54 comprising a specified solder material or materials. Alternatively, donor substrate 52 may comprise a rigid or semi-rigid material. A beam deflector 42 and focusing optics 48 direct the pulses of radiation from LIFT laser 36 to pass through the upper surface of donor substrate 52 and thus impinge on donor film 54 on the lower surface, following a spatial pattern determined by control circuitry 32.

Each laser pulse induces the ejection of one or more molten droplets 56 of solder material from donor film 54 onto a solder bump that was identified as being undersized, such as solder bump 28 in the pictured example. Droplets 56 adhere to and harden on the target solder bump. Each droplet adds a certain amount of solder material to the bump. Control circuitry 32 may thus choose the number of droplets to deposit onto bump 28 based on the total amount of material to be added, as indicated by the height of the bump.

After either ablation to remove excess solder material or deposition of droplets for the purpose of adding solder material to a given target solder bump, reflow laser 38 irradiates the solder bump with sufficient energy to cause the solder material to melt and reflow, thus returning the solder bump to the desired rounded shape and normal height of its neighboring solder bumps 28. Abeam deflector 44 and focusing optics 50 direct the radiation from reflow laser 38 to impinge on the target solder bump. The beam energy and other parameters of reflow laser 38 are selected so as to melt the solder bump while minimizing thermal damage to substrate 24. The beam may be sufficiently energetic to melt the entire volume of the solder bump, or to melt only a part of the solder bump (for example when the preceding ablation or deposition step has affected only the upper part of the solder bump, so that reflow of the entire solder bump is not needed).

To ensure that the thermal effects of solder bump reflow are well localized, with minimal effect on substrate 24 and surrounding solder bumps, in some embodiments of the invention reflow laser 38 emits pulses of laser energy, rather than a continuous wave (CW) beam. Optics 50 focus the beam to impinge on the target solder bump with a beam diameter that is small enough so as not to melt neighboring bumps, and the beam diameter may be less than the bump diameter. The beam diameter is sufficiently large, however, to melt the entire area that has been ablated or covered with molten droplets. For example, the beam diameter used in the reflow stage may be roughly between half and two-thirds of the bump diameter. For solder bumps less than 100 μm in diameter, the pulse duration is desirably less than 100 μs; and for very small solder bumps, for example less than 40 μm in diameter, the pulses may be even shorter, for example as short as 10 μs. These short, intense laser pulses are also beneficial in reducing oxidation of the solder material during the reflow process, making it possible for the reflow process to be carried out under ambient atmospheric conditions. The use of short laser pulse is also advantageous in reducing the sensitivity of the process to small misalignments of the laser beam and to thermal dissipation properties of the solder bump.

To enable the pulse duration to be adjusted for different solder bump sizes and melt depths, reflow laser 38 may comprise a suitable fiber laser or high-power diode laser, for example. If the laser has a sufficiently wide range of adjustment of pulse duration, down to the nanosecond range, it may also serve as ablation laser 34 and possibly LIFT laser 36.

Methods for Solder Bump Repair

Figure 2:
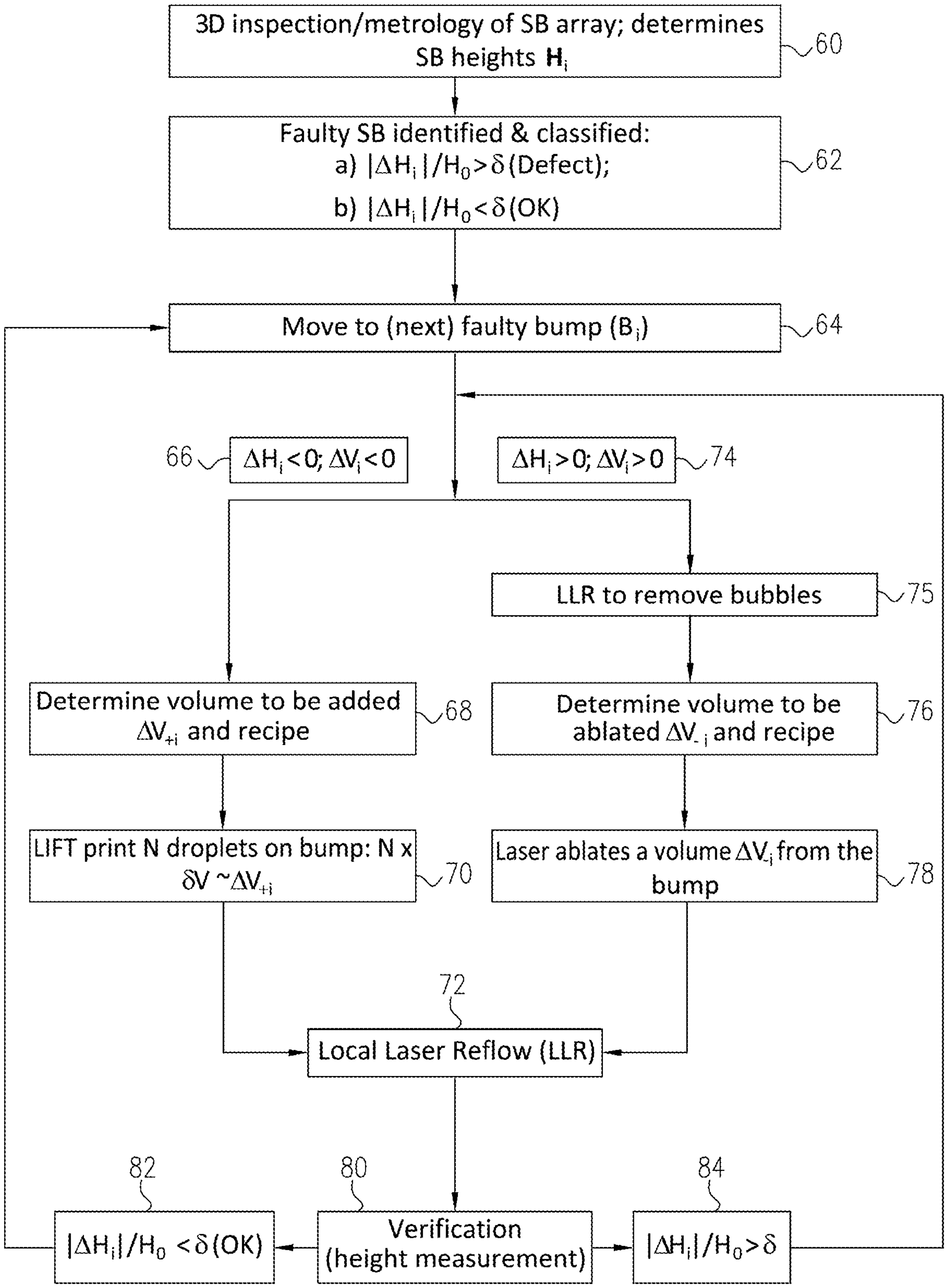
FIG. 2 is a flow chart that schematically illustrates a method for solder bump repair, in accordance with an embodiment of the invention.

FIG. 2 is a flow chart that schematically illustrates a method for solder bump repair, in accordance with an embodiment of the invention. The method is described, for the sake of convenience and clarity, with reference to the elements of system 20, as shown in FIG. 1. Alternatively, however, the principles of the present method may be implemented in other system configurations, all of which are considered to be within the scope of the present invention. For example, separate sub-systems may be used for ablation of oversize solder bumps and for adding material to undersize solder bumps.

The method begins with an inspection step 60, in which inspection module 30 captures image data with respect to an array of solder bumps (SB) 22, 26, 28, . . . . As noted earlier, the term "image data" in this context refers not only to two-dimensional images in the plane of substrate 24, but also depth data in the direction normal to the substrate. Control circuitry 32 processes the image data in order to determine the respective heights $H_i$ of the solder bumps Bi. Control circuitry 32 compares the measured bump heights to the reference design height $H_0$, at a bump classification step 62. For each solder bump, control circuitry 32 computes the height deviation $\Delta H_i = H_i - H_0$. Bumps for which the relative deviation exceeds a certain threshold □, i.e., |□$H_i$|/$H_0$>□□, are classified as defective, while deviations below the threshold are ignored. The value of 6, in other words, defines certain maximal and minimal heights, above and below which the corresponding bumps are identified as defective.

Control circuitry 32 selects one of these defective bumps Bi for repair, at a bump selection step 64. If the height deviation of the bump $\Delta H_i$ is negative, the volume of solder material in the bump $V_i$ is likewise assumed to be less than the design volume, i.e., $\Delta V_i$ is negative, as well. For example, bump 28 in FIG. 1 meets this criterion. In this case, control circuitry 32 routes the bump to a solder deposition branch 66. On the other hand, if the height deviation of the bump $\Delta H_i$ (and hence $\Delta V_i$) is positive, as in bump 26, control circuitry 32 routes the bump to a solder removal branch 74.

In solder deposition branch 66, control circuitry 32 determines the volume of solder material $\Delta V_{+i}$ to be added to solder bump Bi, at a deposition volume estimation step 68. The volume $\Delta V_{+i}$ can be estimated by comparing the measured height and diameter of the solder bump to the design height. Based on this volume and other characteristics, such as the diameter of the bump and the type of solder material, control circuitry 32 also chooses the recipe to apply in repairing the solder bump. The recipe may indicate, for example, the number of droplets to be deposited on the solder bump and the location at which each droplet is to be deposited within the bump area, as well as whether the droplets are to be deposited all at once or in two or more stages, with reflow of the deposited droplets after each stage.

Based on the selected recipe, control circuitry 32 positions donor substrate 52 in the appropriate location in proximity to the solder bump (for example, bump 28), and then fires LIFT laser 36 one or more times to eject droplets 56 onto the solder bump, at a LIFT step 70. The number of droplets is selected so that the volume of the solder material ejected from donor film 54 onto bump 28 cumulatively reaches the volume set at step 68. In other words, if each droplet has a volume $\delta V$, the number of laser pulses N is selected so that $N \times \delta V$ is approximately equal to $\Delta V_{+i}$. After the selected number of droplets have been deposited on solder bump 28, control circuitry 32 directs the beam from reflow laser 38 to irradiate the bump, at a local laser reflow step 72.

In solder removal branch 74, it can sometimes occur that a solder bump is too high not because it contains excess solder material, but rather because it contains one or more air bubbles. In this case, ablation of the bump followed by reflow can result in the height of the bump falling below the desired minimum. To avoid this sort of situation, oversize solder bumps may optionally be irradiated by reflow laser 38 in order to melt the bumps and release any trapped air, at a preliminary reflow step 75. Ablation laser 34 will then be applied to ablate solder material only if the bump height is still over the desired maximum following this preliminary reflow step. Alternatively or additionally, if the height of the solder bump is found to have dropped too low following ablation, the bump may subsequently be returned to deposition branch 66.

Whether or not preliminary reflow step 75 is implemented, control circuitry 32 next determines the volume of solder material $\Delta V_{-i}$ to be ablated from solder bump Bi (for example bump 26), at an ablation volume estimation step 76. The volume in this case, too, can be estimated by comparing the measured height and diameter of the solder bump to the reference design height. As in the solder deposition branch, control circuitry 32 chooses the recipe to apply in repairing the solder bump based on the volume $\Delta V_{-i}$ and other characteristics of the solder bump. The recipe will indicate, in this case, the number of ablation pulses to apply to the solder bump and possibly also the pulse duration and intensity and the pattern of ablation (for example, a circle with diameter roughly equal to half the bump diameter. The recipe may also indicate whether the excess solder material is to be ablated all at once or in two or more stages, with reflow of the remaining solder material after each stage.

Based on the selected recipe, control circuitry 32 fires ablation laser 34 one or more times to ablate material from solder bump 26, at an ablation step 78. The number of pulses is selected so that the volume of the solder material ablated from the solder bump cumulatively reaches the volume $\Delta V_{-i}$ that was set at step 76. After the selected number of ablation pulses, control circuitry 32 directs the beam from reflow laser 38 to irradiate the bump, at local laser reflow step 72.

Following step 72, inspection module 30 is again actuated to measure the height of the solder bump that has been repaired, at a verification step 80. (Alternatively, control circuitry 32 may delay step 80 until multiple bumps have been repaired, and may then inspect all of these bumps together, as at step 60.) The height deviation of the bump $\Delta H_i$ should at this point be reduced relative to the height prior to the repair process. If the relative deviation has now fallen below the threshold □, i.e., |□$H_i$|/$H_0$<□□, the solder bump is considered to be in satisfactory condition, at a repair completion step 82. Control circuitry 32 now returns to step 64 and selects the next solder bump for repair, until no more defective solder bumps remain on substrate 24.

Alternatively, if the relative deviation measured at step 80 is still above the threshold D, i.e., |□$H_i$|/$H_0$>□□, the solder bump is considered to be still defective, at a defective bump detection step 84. In this case, control circuitry 32 returns this bump to either solder deposition branch 66 or solder removal branch 74, as appropriate. The steps of LIFT deposition 70 or ablation 78, followed by reflow step 72 are repeated one or more additional times as needed, until |□$H_i$|/$H_0$<□□.

Techniques for Solder Bump Ablation

Figure 3A:
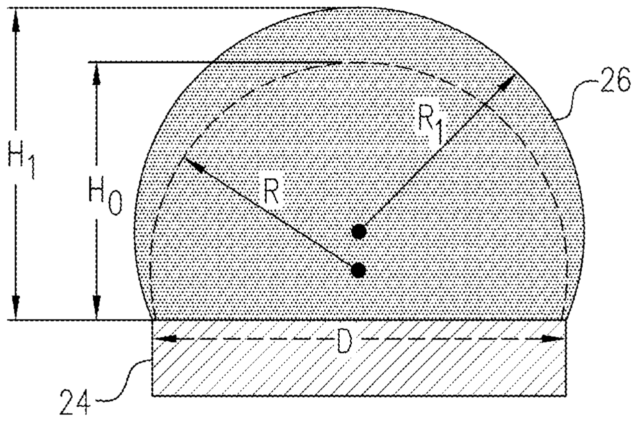
FIGS. 3A and 3B are schematic sectional views of a solder bump before and after laser ablation, respectively, in accordance with an embodiment of the invention.
Figure 3B:
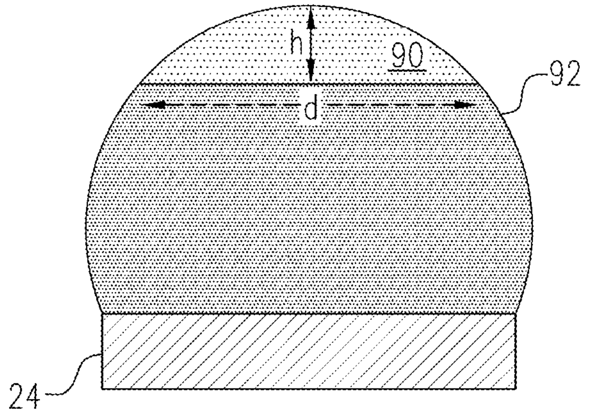

FIGS. 3A and 3B are schematic sectional views of solder bump 26 before and after laser ablation, respectively, in accordance with an embodiment of the invention. As shown in FIG. 3A, solder bump 26 has an initial height $H_1$ that is greater than the nominal value $H_0$. The radius of solder bump 26 is $R_1$, which is greater than the nominal radius R. Since the base (pad) diameter D is known, the initial volume of solder bump 26 is given by the hemispherical equation:

$$V_1 = \frac{1}{6}\pi H_1\left(\frac{3}{4}D^2 + H_1^2\right)$$

To reduce the volume of solder bump 26, control circuitry 32 estimates the excess volume to be removed: □V=$V_1$−$V_0$. In some cases, as described with reference to the figures that follow, it can be advantageous to ablate the excess volume in multiple stages and/or different ablation patterns. In the present example, however, the height of solder bump 26 is simply reduced by an amount h, by ablation of a cap 90, to yield a solder bump 92 with a flat circular surface of diameter d, as shown in FIG. 3B.

The cap parameters are determined based on the measured height $H_1$ of solder bump 26 and the base diameter D. The bump radius is given by:

$$R_1 = \frac{\frac{D^2}{4} + H_1^2}{2H_1}$$

The cap volume to be removed is:

$$\Delta V_{cap} = \frac{1}{6}\pi h\left(\frac{3}{4}d^2 + h^2\right)$$

The height and diameter of cap 90 can then be extracted from the relation:

$$h = R_1 - \sqrt{R_1^2 - \frac{d^2}{4}}$$

Based on the above formulas, control circuitry 32 computes the parameters of the ablation pulse or pulses that are to be directed by ablation laser 34 toward solder bump 26, in order to obtain solder bump 92. Following the ablation, reflow laser 38 is fired to melt solder bump 92, in order to obtain a rounded solder bump whose height is approximately $H_0$ and whose radius is approximately R.

Figure 4:
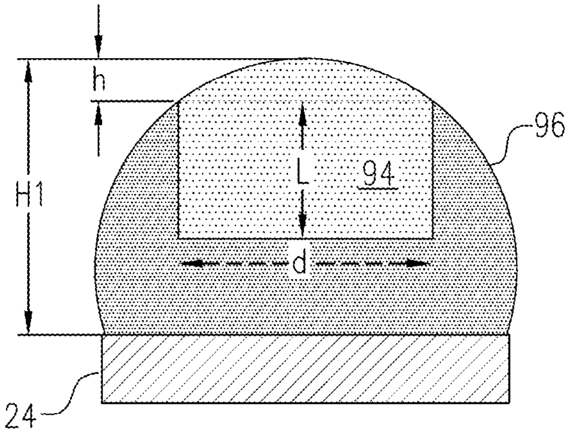
FIG. 4 is a schematic sectional view of a solder bump after laser ablation, in accordance with another embodiment of the invention.

FIG. 4 is a schematic sectional view of a solder bump 96 after laser ablation, in accordance with another embodiment of the invention. In this case, optics 48 focus the beam from ablation laser 34 more sharply onto the oversize solder bump, so that the beam impinges on the solder bump with a beam diameter that is less than the bump diameter. The ablation of the solder material thus creates a cavity 94 of diameter d and depth L in the central area of the identified solder bump. A cap of diameter d and height h (smaller than the ablated cap in FIG. 3B) is ablated, as well. Subsequent melting by reflow laser 38 will cause the solder material to reflow and fill cavity 94, so that the solder bump returns to the desired rounded shape.

The energy and diameter of the ablation laser beam are selected, as in the preceding embodiment, so as to remove a volume of solder material corresponding to the dimensions of the cap and cavity that are computed by control circuitry 32. The approach illustrated in FIG. 4 is advantageous, inter alia, in reducing the amount of debris that is scattered around the area of the solder bump during the ablation. As the debris is conductive, it can cause short circuits if not cleaned away. In the present case, depending on the depth of cavity 94, a substantial fraction of the debris will be trapped inside the cavity, and then will simply reflow into the solder bump when it is melted by reflow laser 38. The laser pulse parameters, as well as the depth and aspect ratio of cavity 94, may be optimized—even extending the cavity down to the underlying pad—in order to achieve the desired ablation volume while minimizing scattering of debris.

Figure 5:
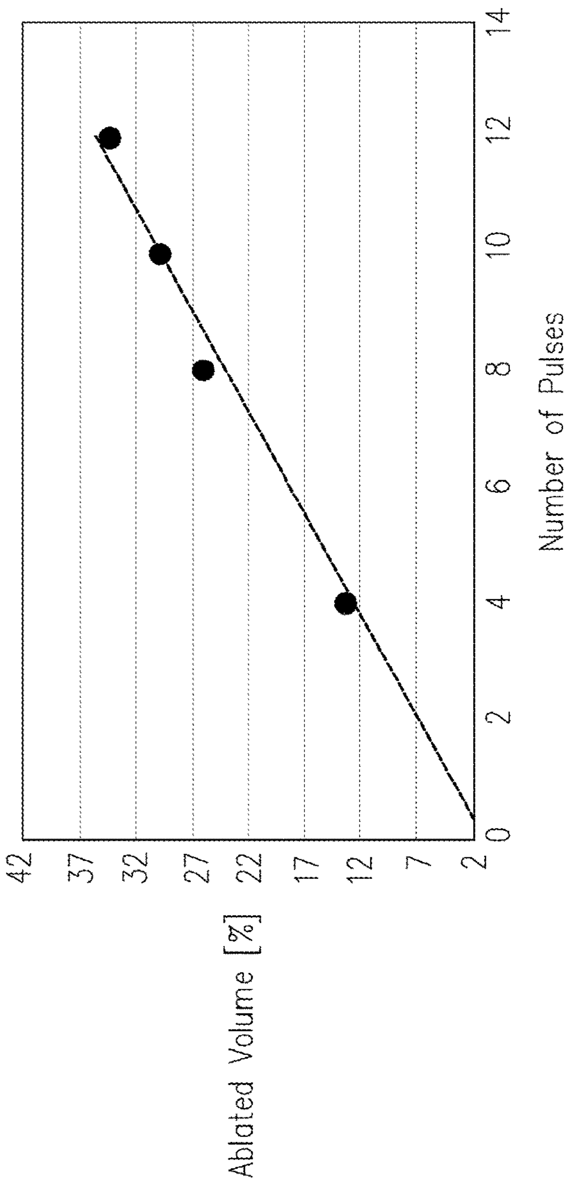
FIG. 5 is a plot that schematically illustrates the volume of material ablated from a solder bump as a function of the number of laser pulses applied to ablate the material, in accordance with an embodiment of the invention.

FIG. 5 is a plot that schematically illustrates the volume of material ablated from a solder bump as a function of the number of laser pulses applied to ablate the material, in accordance with an embodiment of the invention. This plot demonstrates that the amount of solder material removed from a solder bump increases in a roughly linear manner with the number of laser pulses applied. Thus, the amount of solder material ablated per laser pulse can be calibrated, and the number of ablation pulses to apply to a given solder bump can be selected according to the amount of solder material that is to be removed.

Figure 6:
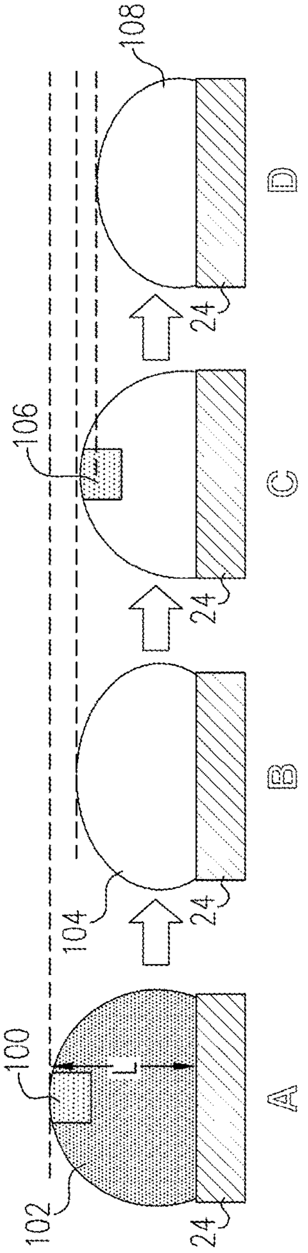
FIGS. 6A, 6B, 6C and 6D are schematic sectional views of a solder bump at successive stages of laser ablation and reflow, in accordance with an embodiment of the invention.

Referring again to FIG. 4, in order to reduce the range of the debris that is scattered during ablation, it is desirable that the cavity that is ablated in the solder bump be as narrow as possible. If the aspect ratio of the cavity is too high, however, air bubbles may be left in the solder bump following reflow. Furthermore, when the aspect ratio is high, the volume of the cavity that is ablated may be smaller than the actual volume of solder material that is to be removed from an oversize solder bump. To mitigate these difficulties while keeping the diameter of the ablated cavity as small as possible, in some embodiments control circuitry 32 repeats the steps of ablation and reflow two or more times, until the height and volume of the solder bump have been reduced to within the desired limits. This iterative approach keeps the ablated volume at each step small enough to allow local ablation at the bump center without ablating too deeply. The local reflow step that follows causes the solder bump to resume its spherical shape before the next ablation takes place FIGS. 6A-D are schematic sectional views of a solder bump 102 at successive stages of an iterative process of this sort of laser ablation and reflow, in accordance with an embodiment of the invention. In FIG. 6A, a small cavity 100 is ablated in solder bump 102. Reflow laser 38 is applied to melt the solder bump, thus creating a solder bump 104 of reduced height and volume, as shown in FIG. 6B. Ablation laser 34 ablates a further cavity 106 in solder bump 104, as shown in FIG. 6C. Finally, as shown in FIG. 6D, reflow laser 38 again melts the solder material, which reflows to form a rounded solder bump 108 of the desired height and volume.

Figure 7:
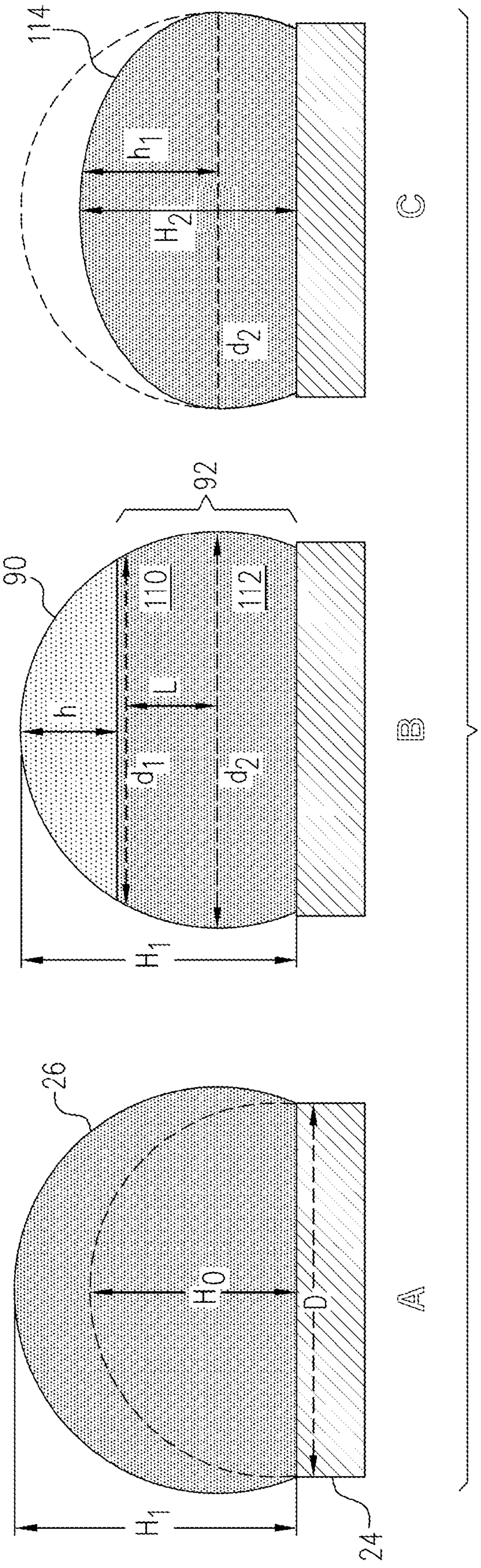
FIGS. 7A, 7B and 7C are schematic sectional views of a solder bump at successive stages of laser ablation and reflow, in accordance with another embodiment of the invention.

FIGS. 7A-C are schematic sectional views of solder bump 26 at successive stages of laser ablation and reflow, in accordance with another embodiment of the invention. In contrast to the preceding embodiments, in which reflow laser 38 applied sufficient energy to melt the entire volume of the solder bump after each stage of ablation, in the present case the energy is reduced, so that only a part of the solder bump (the upper part in this example) melts and reflows. This approach is advantageous in reducing the dissipation of heat to substrate 24 and to surrounding solder bumps. It is also less sensitive to variations in the internal structure of the solder bump, and thus to related variations in thermal conductivity that otherwise might affect the overall melt volume and temperature.

FIG. 7A shows oversize solder bump 26 of height $H_i$, from which a certain volume DV is to be ablated in order to reduce the bump to the nominal volume and height $H_0$. For the sake of simplicity, ablation laser 34 is operated in this example to remove clean-cut cap 90, leaving flattened bump 92 as shown in FIG. 7B. The height h of cap 90 is selected, based on the diameter $d_1$, so that the cap volume precisely equals the excess volume (□$V=V_1-V_0$). Fast laser reflow follows in which, depending on the laser pulse duration and energy, the solder is melted down only to a depth L. As the molten phase depth L is smaller than the bump height after ablation ($H_i-h$), reflow occurs only over an upper part 110 of the bump volume. A lower part 112 remains solid. As shown in FIG. 7C, the recovered shape of a resulting solder bump 114, with a diameter $d_2$, will not exactly match the nominal bump shape, and the bump height $H_2$ will thus be smaller than the nominal height ($H_2<H_0$); but the bump volume will be approximately equal to the nominal volume $V_0$.

As noted earlier, laser ablation of metals typically gives rise to scattered metal droplets and other energetic debris, as well as metal gas and plasma. The scattered debris can contaminate the surrounding area and may also give rise to inaccuracy in the ablation process when debris falls back onto the solder bump. Oxidization of the debris can also affect the electrical properties of the solder bump.

Figure 8:
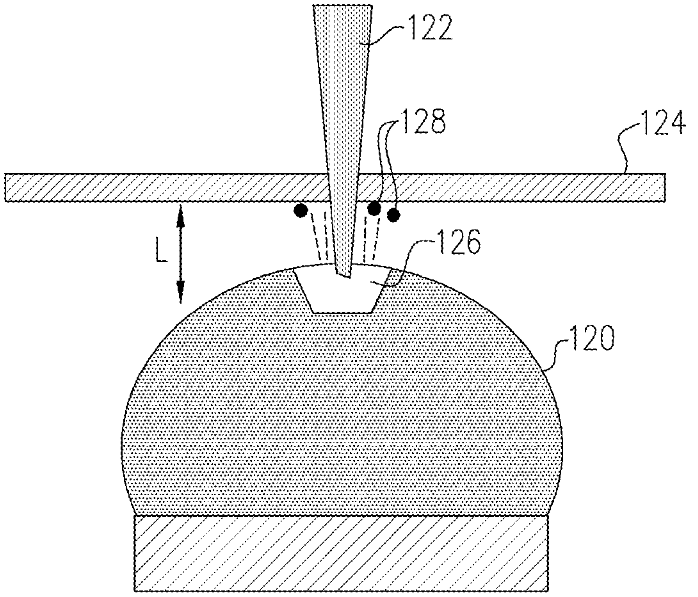
FIG. 8 is a schematic sectional view of a solder bump during an ablation process, illustrating a technique for capture of debris in accordance with an embodiment of the invention.

FIG. 8 is a schematic sectional view of a solder bump 120 during an ablation process, illustrating a technique for capture of debris in accordance with an embodiment of the invention. In this embodiment, a transparent cover 124, for example a suitable glass slide, is positioned over the circuit substrate in proximity to solder bump 120. A beam 122 is directed by ablation laser 34 (FIG. 1) to irradiate solder bump 120 through transparent cover 124, and thus to ablate a cavity 126 to a depth L below the transparent cover. Debris 128 ejected due to the ablation adheres to cover 124, which thus traps the debris and prevents it from re-depositing on solder bump and the surrounding substrate. Cover 124 is placed in close proximity to solder bump 120 in order to maximize the collection capacity and to collect the ablated residues before they cool down by interaction with the ambient air.

The use of a transparent cover of this sort to capture debris is beneficial not only in ablation of solder bumps, but also in other laser micromachining applications, particularly when metals are ablated.

Techniques for Solder Deposition

Figure 9A:
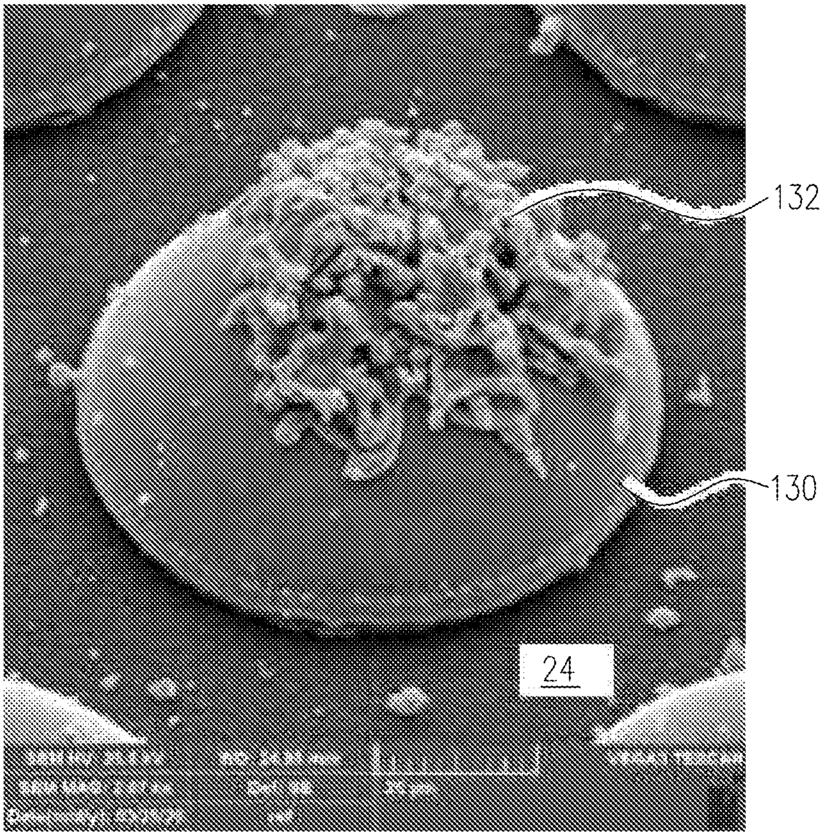
FIG. 9A is a photomicrograph illustrating deposition of solder droplets to increase the volume of a solder bump, in accordance with an embodiment of the invention.

FIG. 9A is a photomicrograph illustrating deposition of solder droplets 132 to increase the volume of a solder bump 130, in accordance with an embodiment of the invention. As can be seen in this figure, the droplets ejected from donor film 54 (FIG. 1) have adhered to the solder bump. The droplet volume and the number of the droplets to be deposited are selected so as to make up the total volume of solder material that is to be added to the solder bump.

Figure 9B:
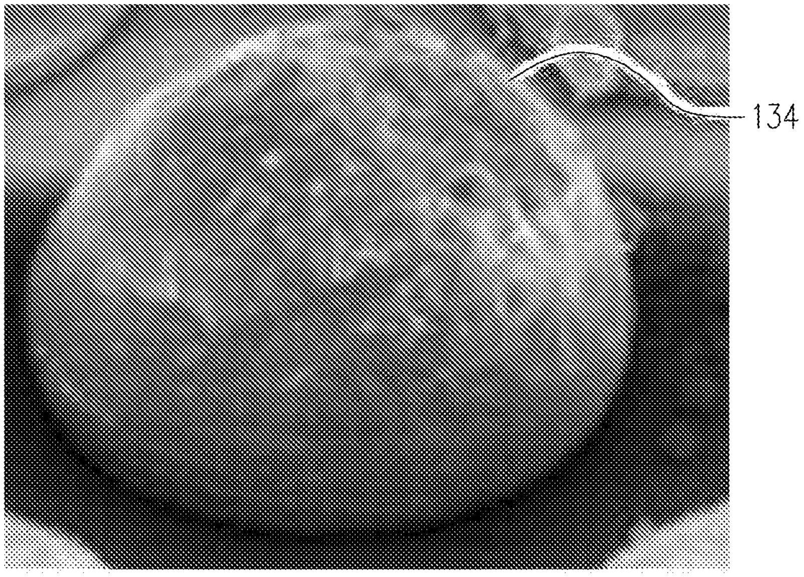
FIG. 9B is a photomicrograph illustrating the solder bump of FIG. 9A following a reflow stage, subsequent to the deposition stage of FIG. 9A, in accordance with an embodiment of the invention.

FIG. 9B FIG. 9B is a photomicrograph illustrating a solder bump 134 following a reflow stage, subsequent to the deposition stage of FIG. 9A, in accordance with an embodiment of the invention. After deposition of droplets 132, reflow laser 38 is actuated to melt the droplets, together with part or all of the volume of solder bump 130 itself, so that the solder bump reflows to the appropriate rounded shape. This cycle of droplet deposition and reflow may be repeated multiple times in order to reach the total required solder bump volume. As in the example shown in FIGS. 7A-C, the energy applied in the reflow stage may be limited so that melt depth is limited, as well, i.e., only the upper part of solder bump 130 is melted together with droplets 132.

LIFT of solder material can be fine-tuned to provide a stable jetting regime, so that each pulse from LIFT laser 36 gives rise to a single droplet of a selected volume. For example, using donor substrate 52 with donor film 54 comprising solder material with thickness in the range of 300-800 nm, and laser pulses with pulse duration between about 1 ns and 20 ns, with pulse energy in the range of 1-5 μJ and laser spot diameter on the donor film in the range of 30-50 μm, the droplet volume can be controlled over a range of about 50-300 fL. The direction of droplet ejection under these conditions is sufficiently well controlled so that donor substrate 52 can be positioned as far as 0.3-0.5 mm away from circuit substrate 24 and still achieve the sort of precise deposition that is shown in FIG. 9. Alternatively, smaller or larger solder droplets can be deposited, provided the donor structure and laser parameters are properly adjusted (although the jetting quality may be compromised, so that it may be desirable to position the donor substrate closer to the circuit substrate).

Judicious selection of the jetting regime is also useful in minimizing the amount of metal debris scattered around the vicinity of the deposition site and facilitating cleanup of the surrounding substrate after LIFT deposition. Following the reflow stage, the circuit substrate can be cleaned, for example using sonication in water. Thus, debris that did not melt during the reflow stage is disconnected from the substrate during cleaning process. Alternatively or additionally, debris may be cleaned from the circuit substrate before reflow using an accurate and delicate laser ablation process.

Figure 10:
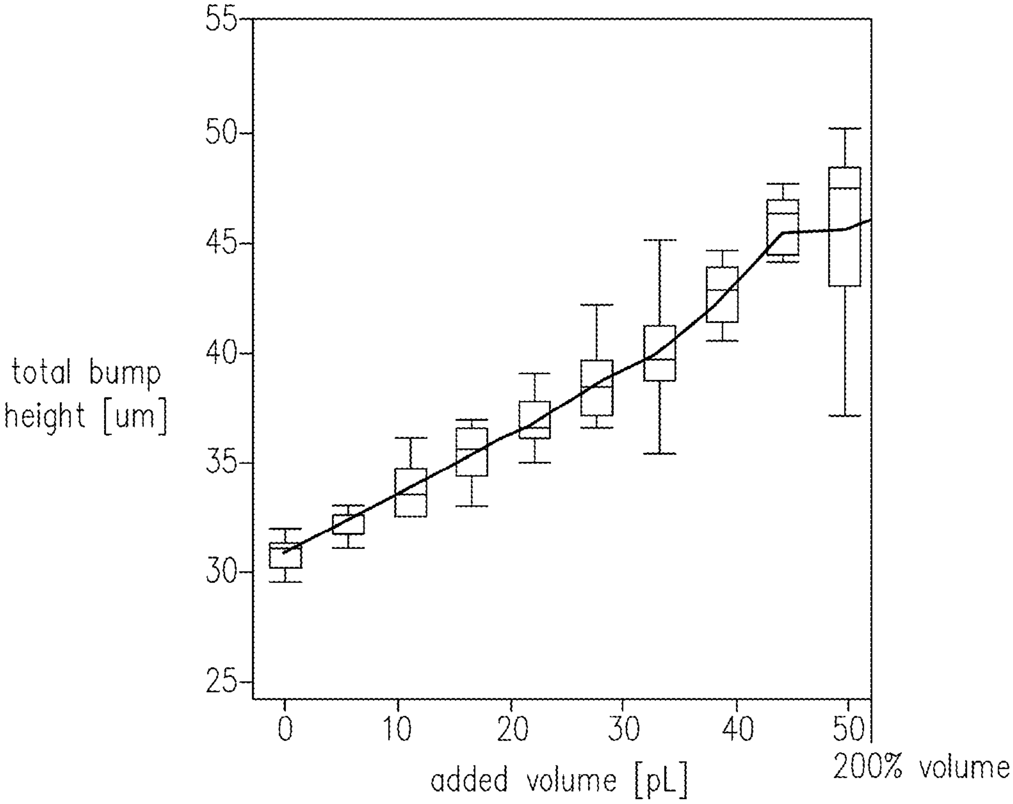
FIG. 10 is a plot that schematically illustrates the increase of height of a solder bump as a function of the volume of solder droplets added to the bump, in accordance with an embodiment of the invention.

FIG. 10 is a plot that schematically illustrates the increase of height of a solder bump as a function of the volume of solder droplets added to the bump, in accordance with an embodiment of the invention. This plot shows measurements made on actual bumps having diameters of 70 μm. The successive bars and boxes show the mean height and standard deviation measured as a function of the added volume, i.e., of the number of droplets deposited. A curve drawn through the mean values illustrates that the height grows linearly with volume up to about 170% of the initial volume. Thus, LIFT-based solder deposition can be used to make precise repairs to undersized solder bumps.

Another method for measuring the total volume of solder deposited at a given location can be based on in-line imaging of the diameter of the hole left in donor film 54 (FIG. 1) after ejection of each droplet 56. The droplet volume can be calculated based on the hole diameter that is shown in the image and the known thickness of the donor film. Experimental measurements can be conducted in order to find any correction factor that may be needed, for example to take into account the rim thickness around the hole.

Further details regarding precise LIFT printing of solder materials, such as features of suitable donor films and solder materials, as well as laser pulse parameters for jetting of solder droplets and reflow of solder bumps, are described in U.S. Provisional Patent Application 63/034,422, filed Jun. 4, 2020, whose disclosure is incorporated herein by reference.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for circuit fabrication, comprising:

optically inspecting an array of solder bumps on a circuit substrate so as to identify a solder bump having a height above the substrate that is greater than a predefined maximum and a solder bump having a height less than a predefined minimum;

wherein for the height of the identified solder bump above the substrate greater than the predefined maximum, the method further comprises:

directing a first laser beam toward the identified solder bump so as to ablate a selected amount of a solder material from the identified solder bump; and after ablating the solder material, directing a second laser beam toward the identified solder bump with sufficient energy to cause the solder material remaining in the identified solder bump to melt and reflow;

wherein for the height of the identified solder bump above the substrate less than the predefined minimum, the method further comprises:

depositing one or more molten droplets of solder material on the identified solder bump, whereby the droplets adhere to and harden on the identified solder bump, wherein depositing the one or more molten droplets comprises ejecting the one or more molten droplets from a donor substrate in proximity to the identified solder bump by a process of laser-induced forward transfer (LIFT); and after depositing the solder material, directing the second laser beam toward the identified solder bump with sufficient energy to cause the deposited solder material to melt and reflow into the identified solder bump.

2. The method according to claim 1, wherein inspecting the array comprises estimating, based on the height of the identified solder bump above the substrate, the amount of the solder material to be removed from the identified solder bump or an amount of the solder material to be added to the identified solder bump;

wherein directing the first laser beam comprises directing a selected number of pulses of laser energy to impinge on the identified solder bump based on the estimated amount of the solder material to be removed; and wherein depositing the one or more molten droplets comprises depositing a selected number of droplets to deposit on the identified solder bump based on the estimated amount of solder material to be added.

3. The method according to claim 1, wherein the identified solder bump has a bump diameter;

wherein directing the first laser beam comprises focusing the first laser beam to impinge on the identified solder bump with a beam diameter that is less than the bump diameter, so that ablation of the solder material creates a cavity in a central area of the identified solder bump; and wherein directing the second laser beam comprises focusing the second laser beam to impinge on the identified solder bump with a beam diameter that is less than the bump diameter, and applying an amount of energy to the identified solder bump to melt only a part of the identified solder bump.

4. The method according to claim 1, wherein further comprising:

when the height of the identified solder bump above the substrate is greater than the predefined maximum, repeating the steps of directing the first laser beam so as to ablate the solder material and directing the second laser beam so as to cause the solder material to melt and reflow multiple times until the height of the solder bump has fallen below the predefined maximum; and when the height of the identified solder bump above the substrate is less than the predefined minimum, repeating the steps of depositing the molten droplets of the solder material and directing the laser beam so as to cause the solder material to melt and reflow multiple times until the height of the solder bump has risen above the predefined minimum.

5. The method according to claim 1, wherein directing the first laser beam comprises positioning a transparent cover over the substrate in proximity to the identified solder bump, and directing the first laser beam to irradiate the identified solder bump through the transparent cover, whereby debris ejected due to ablation of the identified solder bump adheres to the cover.

6. The method according to claim 1, wherein the first laser beam and the second laser beam are generated using a single laser having a variable pulse duration.

7. The method according to claim 1, wherein the donor substrate is transparent and has opposing first and second surfaces and a donor film comprising the solder material on the second surface such that the donor film is in proximity to the identified solder bump, and wherein ejecting the one or more molten droplets comprises directing one or more pulses of laser radiation to pass through the first surface of the donor substrate and impinge on the donor film so as to induce ejection from the donor film onto the identified solder bump of the one or more molten droplets of the solder material.

8. The method according to claim 7, wherein directing the one or more pulses of laser radiation in the process of LIFT and directing the second laser beam toward the identified solder bump comprises using a single laser having a variable pulse duration for both ejecting the molten droplets and causing the deposited solder material to melt and reflow.

9. The method according to claim 1, wherein directing the second laser beam comprises applying sufficient energy to the identified solder bump, using the second laser beam, to melt an entire volume of the identified solder bump, including any deposited solder material.

* * * * *